(12) United States Patent
Nozieres et al.

(10) Patent No.: US 8,409,880 B2
(45) Date of Patent: Apr. 2, 2013

(54) METHOD FOR USE IN MAKING ELECTRONIC DEVICES HAVING THIN-FILM MAGNETIC COMPONENTS

(75) Inventors: Jean Pierre Nozieres, Le Sappey en Chartreuse (FR); Jason Reid, San Jose, CA (US)

(73) Assignee: Crocus Technologies, Grenoble-Cedex (FR)

( * ) Notice: Subject to any disclaimer, the term of this patent is extended or adjusted under 35 U.S.C. 154(b) by 0 days.

(21) Appl. No.: 13/468,936

(22) Filed: May 10, 2012

(65) Prior Publication Data
US 2012/0225499 A1 Sep. 6, 2012

Related U.S. Application Data

(62) Division of application No. 12/500,573, filed on Jul. 9, 2009, now Pat. No. 8,273,582.

(51) Int. Cl.
*H01L 21/00* (2006.01)
(52) U.S. Cl. ............ 438/3; 438/4; 438/48; 438/73; 438/238; 438/240; 257/295; 257/421; 257/422
(58) Field of Classification Search .......... None
See application file for complete search history.

(56) References Cited

U.S. PATENT DOCUMENTS

| | | | |
|---|---|---|---|
| 6,358,756 B1 | 3/2002 | Sandhu et al. | |
| 6,413,788 B1 * | 7/2002 | Tuttle | 438/3 |
| 6,518,071 B1 | 2/2003 | Durlam et al. | |
| 6,521,931 B2 | 2/2003 | Sandhu et al. | |
| 6,673,675 B2 | 1/2004 | Yates et al. | |
| 6,716,644 B2 | 4/2004 | Nejad et al. | |
| 6,737,283 B2 | 5/2004 | Morgan | |
| 6,783,999 B1 | 8/2004 | Lee | |
| 6,927,092 B2 | 8/2005 | Lee et al. | |
| 6,952,360 B2 | 10/2005 | Morgan | |
| 7,071,009 B2 | 7/2006 | Wang et al. | |
| 7,078,239 B2 | 7/2006 | Tuttle | |
| 7,083,990 B1 | 8/2006 | Leuschner | |
| 7,119,388 B2 | 10/2006 | Yates et al. | |
| 7,183,621 B2 | 2/2007 | Nejad et al. | |
| 7,285,811 B2 | 10/2007 | Yates et al. | |
| 7,352,041 B2 | 4/2008 | Horikoshi | |
| 7,442,647 B1 | 10/2008 | Kanakasabapathy et al. | |
| 7,547,559 B2 | 6/2009 | Nejad et al. | |
| 2006/0033133 A1 | 2/2006 | Liu et al. | |
| 2009/0085132 A1 | 4/2009 | Kao et al. | |

* cited by examiner

*Primary Examiner* — Kyoung Lee
(74) *Attorney, Agent, or Firm* — Cooley LLP

(57) ABSTRACT

Disclosed herein is a method of forming electronic device having thin-film components by using trenches. One or more of thin-film components is formed by depositing a thin-film in the trench followed by processing the deposited thin-film to have the desired thickness.

16 Claims, 7 Drawing Sheets

METHOD FOR USE IN MAKING ELECTRONIC DEVICES HAVING THIN-FILM MAGNETIC COMPONENTS

CROSS-REFERENCE TO RELATED APPLICATIONS

This application is a divisional application of U.S. application Ser. No. 12/500,573, filed Jul. 9, 2009.

The subject matter of US patent application US20070263434 to Dieny et al., published Nov. 15, 2007 is incorporated herein by reference in its entirety.

TECHNICAL FIELD OF THE DISCLOSURE

The technical field of this disclosure relates to the art of methods for making devices that comprise thin-film components; and more particularly, to the art of methods for use in making electronic devices having thin-film magnetic components.

BACKGROUND OF THE DISCLOSURE

There are various types of electronic devices that comprise thin-film magnetic components, such as magnetic-random-access-memories and magnetic recording heads. The thin-film magnetic components in these devices are often processed by standard photolithography and etching techniques during fabrication. For electronic devices having magnetic thin-film components and stacks of other thin-film components of different natures or chemical properties, it becomes difficult to efficiently and successfully processing the thin-films using standard lithography and etching techniques. It becomes even more difficult to use standard photolithography and etching techniques to process the thin-films when the thin-films are to be defined into features with characteristic dimensions matching today's technology nodes, such as 130 nm or less.

Taking magnetic-random-access memories (MRAM or MRAM cell) as an example, MRAMs are a new non-volatile memory technology and have been drown great attention in both scientific research laboratories and industries. Their advantageous properties over existing memory technologies for storing digital signals have proved MRAMs to become a promising mainstream memory technology in the recent future.

A MRAM cell uses a magnetic tunnel junction (MTJ) as a storage element; and the MTJ comprises of two magnetic layers separated by a thin (such as 1 nm) insulating layer. One of the two magnetic layers, which is referred to as a reference layer, is characterized by fixed magnetization. The other magnetic layer, which is referred to as a storage layer, is characterized by variable magnetization orientation.

The two magnetic layers of the MTJ are often based on 3d metals (such as Fe, Co, Ni) and 3d metal alloys. The insulating layer laminated between the two magnetic layers in the MTJ often comprises of alumina ($Al_2O_3$) or magnesium oxide (MgO) although many other oxide/nitride materials could in principle be used. In one example, one of the two magnetic layers of the MTJ is made of a synthetic antiferromagnet that involves ultra thin layers of Co-alloys and ruthenium (Ru). One or both of the magnetic layers in the MTJ can be coupled with an anti-ferromagnetic layer, which can be a Mn alloy, such as FeMn, PtMn, and IrMn.

A MRAM cell may comprise additional functional elements, such as, buffer layers to promote adhesion and texture, capping layers prevent corrosion or materials inter-diffusion, electrical contact layers, thermal barriers, and spin polarizing layers. Because of different desired functions of different elements, a MRAM cell may comprise of various materials, some of which can be uncommon materials such as NiFe, CuN, NiFeCr, Pt, GeTeSb, and BiTe, as well as usual semiconductor materials such as Ti, TiN, TiW, TiWN, W, Ta, Cu, and CoSiN.

The combination of many materials with very different chemical natures makes it difficult if not impossible to etch using existing semiconductor processing techniques, especially when it is to be patterned into small individual elements ("cells") at features sizes matching today's technology nodes (130, 90, 65 nm going down to 45, 32, 22 nm). In addition, it is always desired to preserve the chemical/crystalline nature of the tunnel barrier/storage and reference layers interfaces so as to achieve desired electrical characteristics of the MRAM cell. In particular it is always desired to avoid disturbing the magnetic properties of the reference and storage layers. It is also desired to avoid variation of the critical dimension of the MRAM cell. It is also desired to avoid damages of the tunnel barrier layer by means of atomic diffusion of metallic species and/or modification of oxygen content. It is further desired to avoid electrical shorting of the tunnel barrier layer by metallic sidewalls re-depositions during fabrications.

Amongst the existing etch techniques that are commonly used in the semiconductor and thin film industry, wet etch is unsuitable for processing MRAM features, especially those features with critical dimensions. Ion beam etching (IBE) is unsuitable either for processing MRAM features due to the following reasons. An IBE etch is often driven by high energy ions that sputter off the target material. Heavy sidewall re-deposition occurs as the sputter species being non-volatile by nature. Although etching at a grazing incidence may reduce sidewall re-deposition, such grazing incidence is primarily practical for isolated devices (such as recording heads) but not for dense MRAM cells, such as an array of MRAM cells, which is necessary for practical memory applications. Moreover, IBE etch may result in etched sidewalls being slopped due to non-isotropic etch, which in turn, causes severe critical dimension gain at the tunnel junctions of MRAM cells.

Reactive ion etching, which is capable of achieving features of critical dimensions in MRAM cells and clean vertical sidewalls, is however difficult to implement due to the multiple and often chemically incompatible elements in MTJs of MRAM cells. This arises from the fact that some of MTJs are comprised of highly non volatile elements (such as Pt and Co). Some of MTJs are comprised of highly volatile elements (such as Ge and Te); while some of MTJs are comprised of elements that are highly sensitive to corrosion (such as elements Fe and Ni). Some MTJs are comprised of elements prone to solid state diffusion (such as elements Mn, Cu, and Sb). It is therefore very difficult to find an appropriate combination of chemistry and etching parameters (such as temperature and power) to achieve a proper etch.

MTJs of MRAM cells patterning is currently performed either by means of IBE in the data storage market, where structures are isolated by nature and grazing incidences can be used, or by means of RIE in MRAM applications, wherein large densities are required. It is believed however that as the feature size is decreased and the complexity of MTJ stacks are increased, existing etching techniques will become more and more difficult to implement in processing MRAM cells.

In view of the foregoing, it is desired for a method of processing thin-film components in electronic devices.

SUMMARY

In one example, a method is disclosed herein, the method comprising: providing a substrate that comprises a first magnetic layer on the substrate; forming a trench and a dielectric tunnel junction layer on the substrate such that at least a portion of the exposed first portion of the trench is covered by the dielectric tunnel junction layer; depositing a second magnetic layer after the dielectric tunneling layer such that a thin-film of the free magnetic layer is formed above the dielectric tunnel junction layer within the trench so as to form a magnetic tunnel junction at the first of the trench.

In another example, a method is disclosed herein, the method comprising: providing a substrate; forming a trench, comprising: depositing a trench layer on the substrate; and forming a trench in the trench layer; forming a plurality of thin-film components of a device in the trench, wherein the plurality of thin-film components comprises at least a magnetic thin-film component, comprising: depositing the plurality of thin-film components in the trench and on the trench layer; and processing the deposited thin-film components by removing a portion of the deposited layers on the trench layer such that the thin-film components within the trench have a desired thickness.

In yet another example, a method is disclosed herein, the method comprising: providing a substrate comprising a first magnetic layer and a magnetic tunnel junction layer of a magnetic-random-access memory cell; depositing a trench layer on the substrate; etching the trench layer to form a trench, wherein the etching is stopped by the magnetic tunnel junction layer or by a trench layer ; and wherein a portion of the tunnel junction layer is exposed at the first of the trench; depositing a stack of thin films in the trench and on the trench layer; and processing the deposited stack of thin films and the trench layer such that the stack of thin films within the trench has a desired thickness.

DETAILED DESCRIPTION OF SELECTED EXAMPLES

Disclosed herein is a method for use in making electronic devices that comprise thin-film components. The method is particularly useful for defining stacks of thin-films of different chemical properties or natures in electronic devices, especially stacks of thin-film components having magnetic thin-films in electronic devices. More particularly, the method is of great value in defining stacks of thin-film components having magnetic thin-film components with critical dimensions in electronic devices.

The method uses a trench to define at least a thin-film component of an electronic device, thereby, eliminating the necessity of photolithography and etching for defining the thin-film component. The thin-film component can have a different chemical property or nature than another or other components, especially thin-film component(s) of the electronic device. The thin-film component defined using the trench can be a member of a stack of thin-film components of an electronic device, or can be a stand-alone thin-film component of the electronic device; and may or may not be a magnetic thin-film component. By forming the trench at desired dimension, the thin-film component fabricated by using the trench may have any desired dimensions. In one example, the thin-film component may have a critical dimension, such as a characteristic dimension (e.g. lateral or vertical dimension) of 2000 nm or less, 1500 nm or less, 700 nm or less. 400 nm or less, 200 nm or less, 100 nm or less, 90 nm or less, 65 nm or less, 45 nm or less, 32 nm or less, 22 nm or less.

A thin-film in this disclosure is referred to as a material layer that is formed by depositing the material using one or more film deposition techniques, such as physical-vapor-deposition (PVD), chemical-vapor-deposition (CVD), physical-energized-chemical-vapor-deposition (PECVD), and other techniques. A magnetic thin-film in this disclosure is referred to as a thin-film comprising at least a magnetic material. A thin-film component in this disclosure is referred to as a functional component defined from a thin-film. A magnetic thin-film component in this disclosure is referred to as a functional component of an electronic device derived from a magnetic thin-film.

The method will be detailed in the following with reference to selected examples wherein the method is used for making electronic devices having magnetic thin-film components. It will be appreciated by those skilled in the art that the following discussion is for demonstration purposes and should not be interpreted as a limitation. Other variations with the scope of this disclosure are also applicable. For example, the method is also applicable for making other types of electronic devices having thin-film components.

Figure 1A:
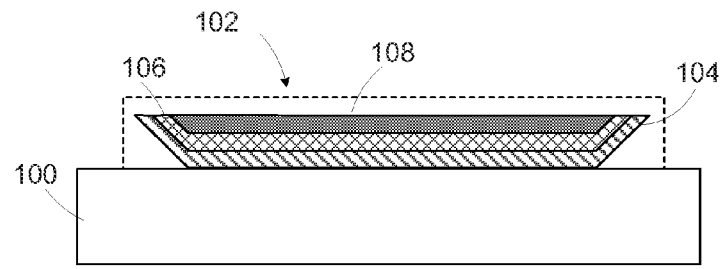
FIG. 1a through FIG. 1e diagrammatically illustrate cross-sectional views of an exemplary electronic devices having a magnetic thin-film component during an exemplary fabrication process.

Referring to the drawings, FIG. 1a through FIG. 1e diagrammatically illustrates an exemplary method of making an electronic device having a magnetic thin-film component by using a trench. As illustrated in FIG. 1a, the electronic device comprises substrate 100 and element 102 that comprises thin-film components 104, 106, and 108. The thin-film components each may comprise any desired materials; and the materials of the thin-film components may or may not have different chemical properties or natures. In one example, one or more of the thin-film components 104, 106, and 108 comprise a magnetic material. The magnetic thin-film may be comprised of iron, nickel, cobalt, or rare earth elements, 3d metals (e.g. Fe, Co, Ni), 3d metal alloys (e.g. Mn alloy such as FeMn, PtMn, and IrMn), Co-alloys (e.g. CoFeB and CoFe), NiFe, CuN, NiFeCr, Pt, GeTeSb, BiTe, as well as usual semiconductor materials such as Ti, TiN, TiW, TiWN, W, Ta, Cu, and CoSiN.

In another example, one or more of the thin-film components 104, 106, and 108 comprise a material such that a thin-film comprised of such material is difficult if not incapable to be patterned using standard or existing photolithography techniques. In yet another example, one or more of the thin-film components 104, 106, and 108 comprise a material such that patterning/etching a thin-film comprised of such material is different from that for other thin-film components of the electronic device.

In general, element 102 may be comprised any desired numbers of thin-film components. Element 102 may also comprise other non-thin-film components (e.g. components not fabricated by standard thin-film techniques). The substrate (100) can be comprised of any suitable materials. In one example, the substrate 100 can be comprised of substantially a single material, such as a semiconductor material (e.g. Si or Ge), a dielectric material (e.g. $SiO_2$), or a conductive material (e.g. Al and Cu). The substrate (100) may be comprised of a crystalline material, an amorphous material, a glass, a polymer, a nanostructure material, or other types of materials. Alternatively, the substrate (100) may be a substrate assembly that comprises one or more functional components, such as thin-film components and other functional components, an example of which will be discussed afterwards with reference to FIG. 2.

Element 102 and the functional members in element 102 may have any desired dimensions (e.g. lateral and vertical dimensions). In one example, element 102 and at least one of the thin-film components 104, 106, and 108 of element 102 have a critical dimension; and the critical dimension can be along the horizontal and/or vertical directions.

Figure 1B:
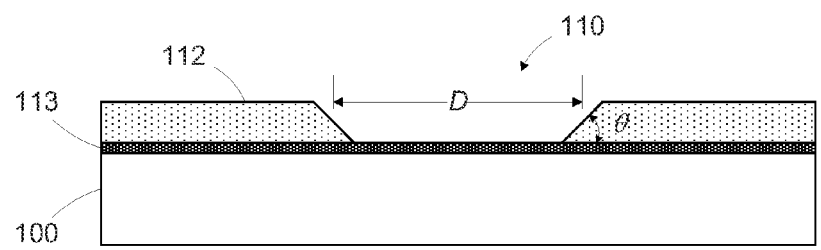
Figure 1C:
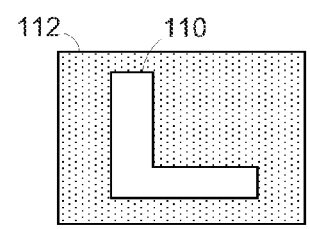

Element 102 on substrate 100 can be fabricated in many ways, one of which is by using a trench, such as trench 110 in trench layer 112 as illustrated in FIG. 1b. Referring to FIG. 1b, trench layer 112 is deposited on substrate 100. The trench layer may be comprised of any suitable materials, such as a dielectric material (e.g. an oxide, a nitride, a carbide, an oxy-nitride, a carbon-oxy-nitride, or any combinations thereof) or a wide range of other materials. In one example, the trench layer may be comprised of amorphous silicon or other suitable materials, such as organic materials and polymers.

Depending upon the specific material, the trench layer (112) can be deposited using any standard or existing film-deposition techniques, such as CVD, PVD, or PECVD. The deposited trench layer (112) is patterned, for example using an existing photolithography technique, so as to form trench 110. The deposited trench layer is patterned, for example, using a suitable photolithographic technique.

As an alternative feature, a protection layer, such as protection layer 113 can be deposited on substrate 100 before depositing trench layer 112. The protection layer (113) can be used for protecting the top surface of the substrate, especially the portion of the top surface at the bottom of the desired trench, during the processes of depositing the trench layer and patterning the trench layer for forming the trench. The protection layer (113) can be removed before releasing the electronic device. Specifically, the bottom portion of the protection layer can be removed during or after forming the trench, and preferably before depositing the thin-films in the trench, such as before depositing a thin-film for forming thin-film component 104 in the trench. The remaining portion of the protection layer (113) can be removed before releasing the electronic device, such as before, during, or after the etching process for removing the trench layer 112. In some examples, the protection layer (113) can also be used as an etch stop layer. Specifically, the protection layer (113) can be comprised of a material that is highly resist to the etching used for patterning the trench layer (112) in forming trench 110. For example, the protection layer can be comprised of carbon, which acts simultaneously as an etch stop layer.

Trench 110 has a dimension corresponding to the dimension of the desired element (e.g. element 102) to be formed using the trench. For example, trench 110 has a depth that is substantially equal to the desired thickness of the element to be formed using the trench. In the example of forming element 102 using the trench, trench 110 has a depth that is substantially equal to the total thicknesses of thin-film components 104, 106, and 108 of element 102. The desired depth of the trench can be obtained by depositing the trench layer (113) at a proper thickness. The lateral dimension (e.g. width D) of trench 110 corresponds to the lateral dimension of the element to be formed using the trench. In an example wherein element 102 has a critical lateral dimension, trench 110 has a characteristic lateral dimension that is substantially equal to the desired critical lateral dimension of element 102.

The side walls of trench 110 may be substantially vertical such that angle θ is substantially 90°. In other examples, the trench has sloped sidewalls such that angle θ is off from 90°. Specifically, angle θ can be less than 90°, such as 30° or less, 20° or less, 10° or less, 5° or less but larger than 0°. This configuration is advantages for improving continuity of the thin-film(s), especially the continuity of the magnetic property of the magnetic thin-film, subsequently deposited in the trench, which will be discussed afterwards with reference to FIG. 2.

In another example, the angle θ can be larger than 90°, such as 110° or larger, 120° or larger, 140° or larger, 160° or larger but less than 180°. This configuration is especially useful for obtaining discontinuity of the portion of the subsequently deposited thin-film (e.g. a thin-film for defining thin-film component 104) in the trench from the top surface of the protection layer (if provided) or the top surface of the substrate 100 if the trench is formed on the surface of the substrate.

The trench can be formed into any desired geometric shapes. In the top view, the trench can be a rectangle, square, circle, or other simple shapes. The trench can alternatively be formed to take other complicate shapes, such as an "L" shape, as diagrammatically illustrated in FIG. 1c, and other desired shapes.

Figure 1D:
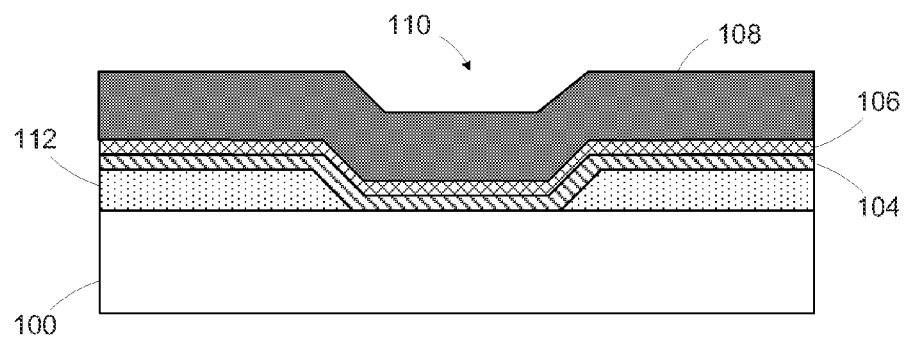
Figure 1E:
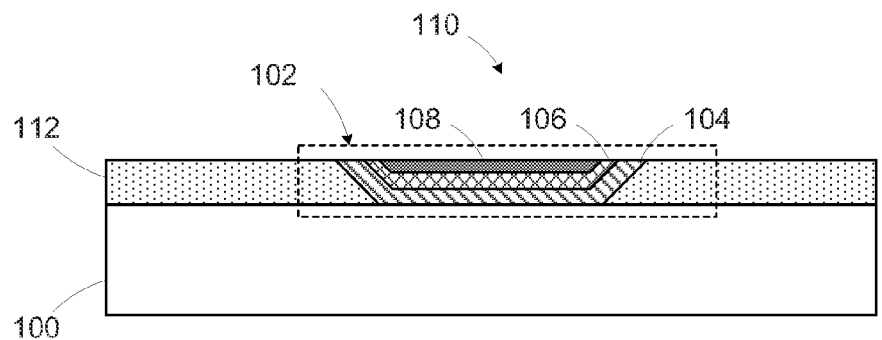

Thin-film components can then be formed by using the trench as diagrammatically illustrated in FIG. 1d. Referring to FIG. 1d, thin films 104, 106, and 108 can be deposited consecutively on the patterned trench layer 112 and the substrate 100 with each having a desired thickness. The portions of the deposited thin-films 104, 106, and 108 above the top surface of the trench layer 112 can be removed while leaving portions of the thin-films 104, 106, and 108 in the trench 110, as diagrammatically illustrated in FIG. 1e. The portions of the thin-films above the trench layer 112 can be removed by many possible ways, such as chemical-mechanical-polishing (CMP). The remaining portions of the thin-films in the trench 110 form the desired element 102.

Because the thin film components (e.g. components 108, 16, and 104) are formed with the trench (110) and thin-film deposition techniques, one or more formed thin film components, such as thin-film components 104 and 106, have vertically extended end portions due to the trench. As a consequence, for example, thin film components 104 and 106 each have a "U" shape. Because of the CMP followed by thin film deposition, the topmost thin-film component (e.g. 108) can be wrapped up by the vertically extended end portions of the lower thin-film component(s).

Because the trench has the desired shape with desired dimensions, the element 102 formed in the trench has the desired shape and dimensions. As such, the thin-film components 104, 106, and 108 of element 102 are formed from thin-films but without lithography.

After forming the thin-film components, the trench layer 112 can be removed by suitable methods, such as etching, depending upon the material of the trench layer. In examples wherein the trench layer is to be removed by etching, energized or non-energized or combinations thereof can be used. The etching can be wet etching or dry etching or a combination thereof. Depending upon the material of the trench layer, a wide range of etchant can be used, such as etchants comprising a spontaneous chemical component that is capable of chemically reacts with the target trench material spontaneously.

The above method can be used in fabricating a wide range of devices having thin-film components. As an example, the above method can be used in fabricating magnetic-random-access memories (MRAM), one of which is diagrammatically illustrated in FIG. 2. It will be appreciated by those skilled in the art that the MRAM cell to be discussed in the following is only one of many possible MRAM cells that can be fabricated by examples of the method as discussed above with reference to FIG. 1a through FIG. 1e. For example, the method can be implemented in fabrications of other varieties of MRAMs, such as field-induced-magnetic switching devices, thermally-assisted magnetic switching devices, current-induced magnetic switching devices, and other devices with thin-film components that may or may not be magnetic.

Figure 2:
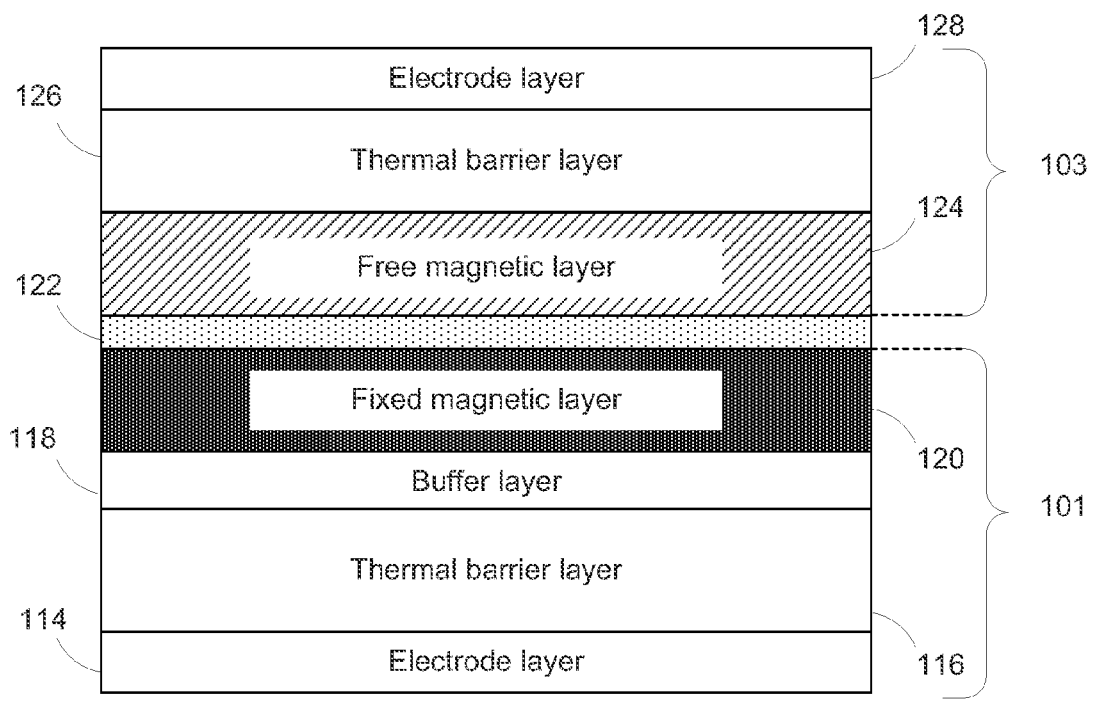
FIG. 2 diagrammatically illustrates a cross-sectional view of an exemplary magnetic-random-access-memory magnetic stack.

Referring to FIG. 2, the exemplary MRAM comprises of first portion 101, second portion 103, and dielectric tunnel junction layer 122. The first portion 101 comprises fixed magnetic layer 120 whose magnetic orientation does not change during operation. The second portion (103) comprises free-magnetic layer 124 whose magnetic orientation varies during operation. It is noted that even though it is shown in FIG. 2 that the free magnetic layer is above the fixed magnetic layer, it is only one of examples. In other examples, the fixed magnetic layer can be above the free magnetic layer. Varieties of other functional elements can be included in the second and first portions. For example, the first portion (101) may also comprise electrode 114, thermal barrier 116, and buffer layer 118. The second portion (102) may also comprise barrier layer 126 and electrode 128.

The electrode layers 128 and 114 provide electrical contacts (electrodes). Accordingly, the electrode layers each comprise an electrically conductive material, such as metallic elements, metallic alloys, metallic compounds, inter-metallic compounds, and any combinations thereof. Each electrode layer can be a laminate comprising multiple layers of different materials.

The thermal barrier layers (126 and 116) act to prevent thermal leakage to/from the magnetic element. Specifically, the thermal layers are used for confining heat at the level of the storage layer so as to minimize the power consumption during operation (e.g. during switching of the magnetization orientation). In one example, the thermal barrier layer has a thermal conductivity of 2W/m.k or lower, such as 1W/m.k or lower, or 0.5W/m.k or lower, and preferably has a heating or cooling time of 10 ns or less, such as 5 ns. An exemplary structure of the thermal layers (126 and 116) is diagrammatically illustrated in FIG. 6, which will be detailed afterwards.

The MRAM as illustrated in FIG. 2 can be fabricated by using a trench as discussed above with reference to FIG. 1a through FIG. 1e. One example is diagrammatically illustrated in FIG. 3a through FIG. 3c.

Figure 3A:
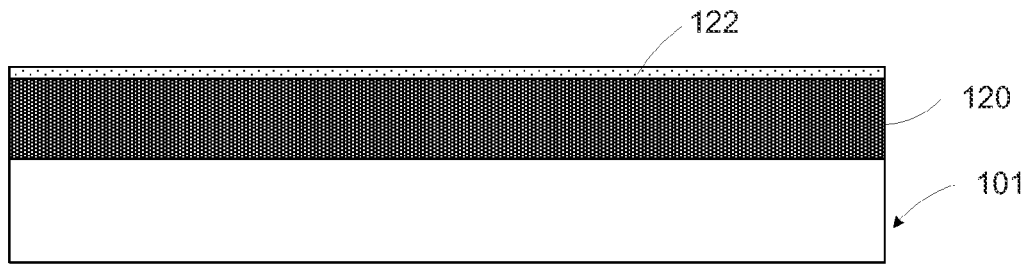
FIG. 3a through FIG. 3c diagrammatically demonstrate an exemplary method of fabricating the magnetic-random-access-memory magnetic stack illustrated in FIG. 2.

Referring to FIG. 3a, portion 101 is provided, which comprises fixed magnetic layer 120. The portion 101 can be fabricated by a sequence of standard thin-film techniques to form desired thin-film components, such as thermal barrier layer 118 and fixed magnetic layer 120, of portion 101. The portion 101 is then treated as substrate 100 in FIG. 1a through FIG. 1e; and the other thin-film components of the MRAM are consecutively formed on the substrate. As illustrated in FIG. 3a, dielectric tunnel junction layer 122 is formed on substrate 101, by for example, a standard thin-film deposition technique, which may be followed by patterning if needed.

Figure 3B:
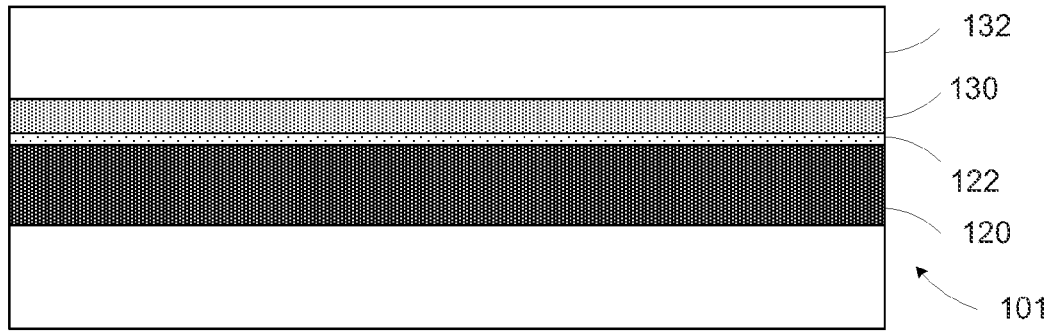
Figure 3C:
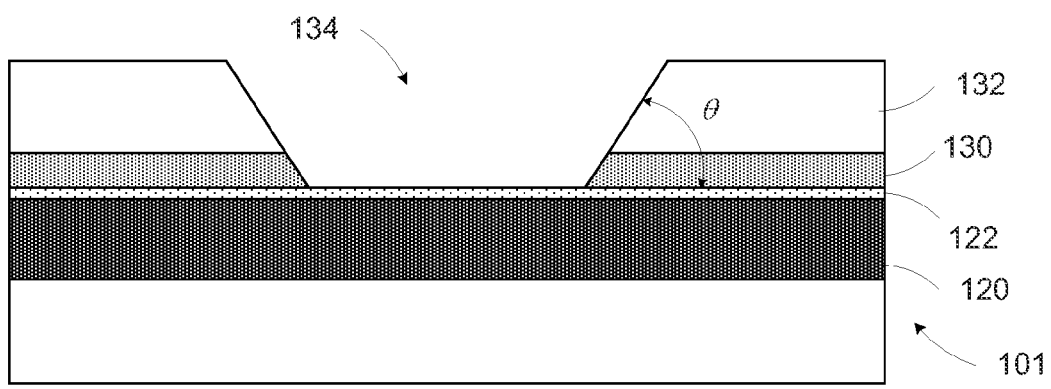

As illustrated in FIG. 3b, trench layer 132 can be deposited on the dielectric tunnel junction layer 122. The deposited trench layer has a thickness that is substantially equal to the desired thickness of the element to be formed in the trench (e.g. the total thickness of thin-film components 124 and 126). As an alternative feature, through not required, protection layer 130 can be deposited prior to trench layer 132 for protecting the dielectric tunnel junction layer (122). The trench layer (132) and protection layer 130 (if provided) can be patterned so as to form trench 134 as illustrated in FIG. 3c. The functional thin film components, such as free magnetic layer 124, barrier layer 126, as well as electrode 128, of portion 103 as illustrated in FIG. 2 can then be formed in trench 134 using the method as discussed above with reference to FIG. 1a through FIG. 1e, which will not be repeated herein. After forming the functional members of the MRAM, the trench layer (132) may or may not be removed.

During the process for forming trench 134 s shown in FIG. 3c, the trench material at the trench location may or may not be removed after opening the trench at the desired trench location. For example, if the trench material left in trench 134 is a thin enough insulation layer and can be a part of the tunnel junction layer, this trench material can be maintained as part of the tunnel junction layer. Otherwise, the trench material at the location of desired trench 134 is removed. For example wherein the trench layer is comprised of amorphous C, an oxygen ash process can be performed to remove the trench material at desired trench location 134.

It is noted that the trench (134 as shown in FIG. 3c) has an angle θ, which can be configured into any desired values. As discussed above with reference to FIG. 1b, the trench (110) may have tilted side walls; and angle θ can be less than 90°, such as 30° or less, 20° or less, 10° or less, 5° or less but larger than 0°; or alternatively, can be larger than 90°, such as 110° or larger, 120° or larger, 140° or larger, 160° or larger but less than 180°. In examples wherein angle θ is less than 90° but larger than zero degree, the portion of the deposited free magnetic layer (124) in the trench can be substantially continuous from the portion of the tunnel junction layer 122 without disturbing its magnetic property.

When θ is small, the magnetostatic field generated by the magnetic layers (i.e. the free magnetic layer 124 and the fixed magnetic layer 120) remains marginal to enable the switching fields of the magnetic layer (e.g. the free magnetic layer 124) can remain comparable to that of blanket planar thin-films.

In examples wherein angle θ>90°, the portion of the deposited free magnetic layer (124) in the trench can be discontinuous from the portion of the tunnel junction layer 122. To improve the discontinuity, the angle θ can be large enough such that the thin-film (e.g. the free magnetic layer 124) at the bottom of the trench can be sufficiently flat.

Figure 4A:
FIG. 4a through FIG. 4d diagrammatically demonstrate another exemplary method of fabricating the magnetic-random-access-memory magnetic stack illustrated in FIG. 2.
Figure 4B:
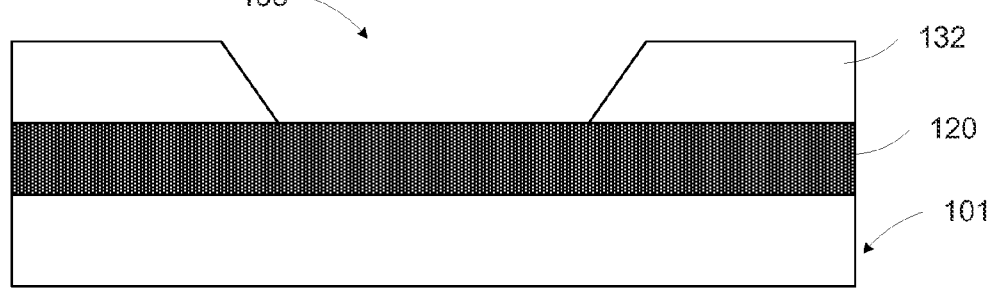
Figure 4C:
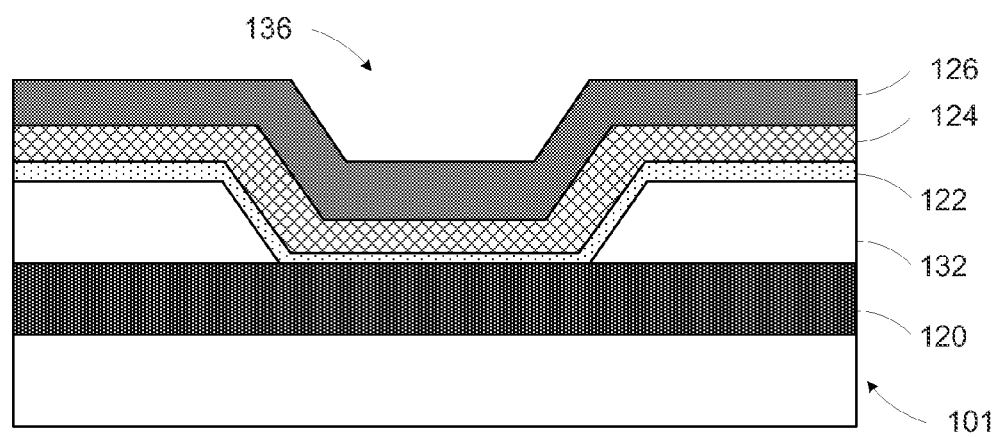
Figure 4D:
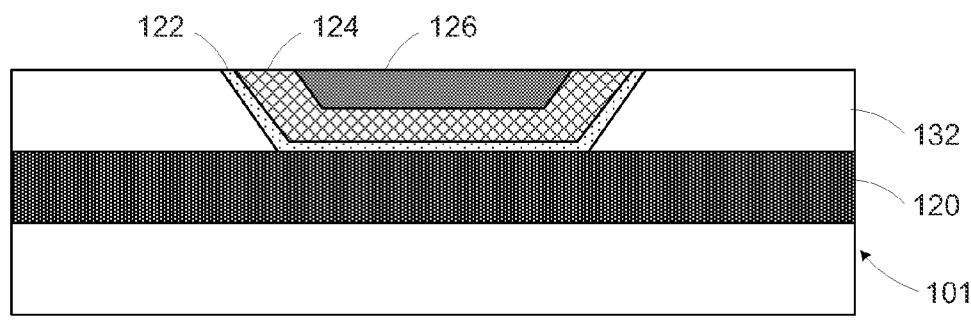

Another exemplary method of forming the MRAM illustrated in FIG. 2 is schematically demonstrated in FIG. 4a through FIG. 4d. Referring to FIG. 4a, the first portion 101 comprising fixed magnetic layer 120 is provided, which can be prepared by the same method as discussed above with reference to FIG. 3a. Trench layer 132 is deposited on substrate 101 and patterned so as to form trench 136 as illustrated in FIG. 4b. The trench layer has a thickness that is substantially equal to the thickness of the desired thin-film components to be formed in the trench. Dielectric tunnel junction layer 122 and the functional elements (e.g. free magnetic layer 124 and thermal barrier layer 126) of the portion 103 of MRAM (as shown in FIG. 2) are consecutively deposited in trench 136, as illustrated in FIG. 4c. A polishing process, such as a chemical-mechanical-polishing process, can be performed to remove the portions of the deposited thin-films above the surface of trench layer 132 as illustrated in FIG. 4d. Other fabrication process can be performed. For example, an electrode can be formed on the top surface of thermal barrier layer 126.

Figure 5A:
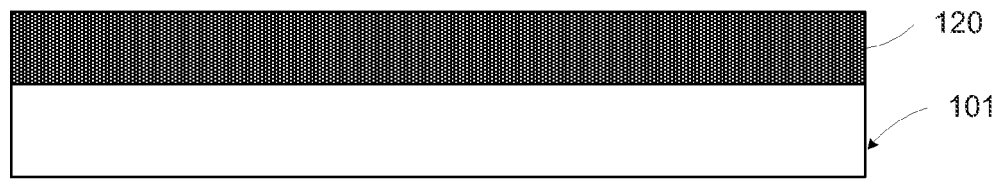
FIG. 5a through FIG. 5d diagrammatically demonstrate yet another exemplary method of fabricating the magnetic-random-access-memory magnetic stack illustrated in FIG. 2.

Yet another exemplary method of making the MRAM illustrated in FIG. 2 is diagrammatically illustrated in FIG. 5a through FIG. 5d. Referring to FIG. 5a, the first portion (101) comprising fixed magnetic layer 120 is provided, which can be prepared by the same method as discussed above with reference to FIG. 3a.

Figure 5B:
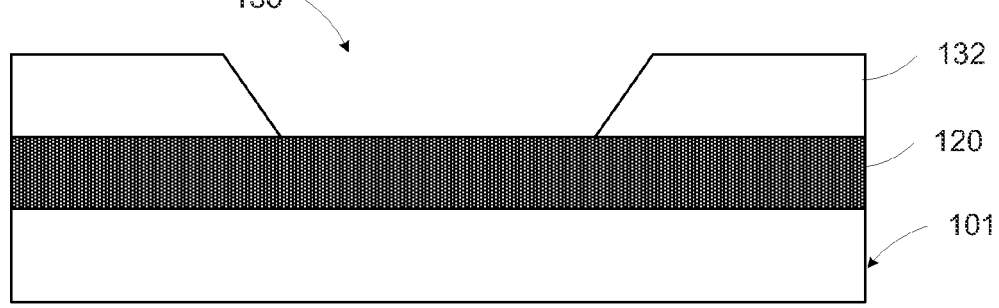

Trench layer 132 is deposited on substrate 101 followed by patterning so as to form trench 138 as illustrated in FIG. 5b. In this example, the trench (138) has a depth less than the total thickness of the thin-film components of the second portion 103 of MRAM in FIG. 2. However, the trench (138) has a lateral dimension corresponds to the desired lateral dimension of the tunnel junction. Specifically, the bottom of the trench can have a critical dimension (or other desired dimensions of the magnetic tunnel junction) corresponding to the dimension of the magnetic tunnel junction.

Figure 5C:
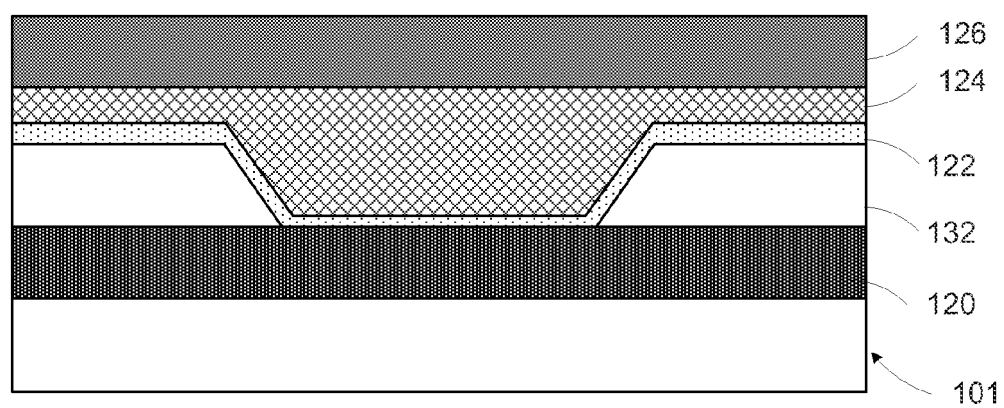
Figure 5D:
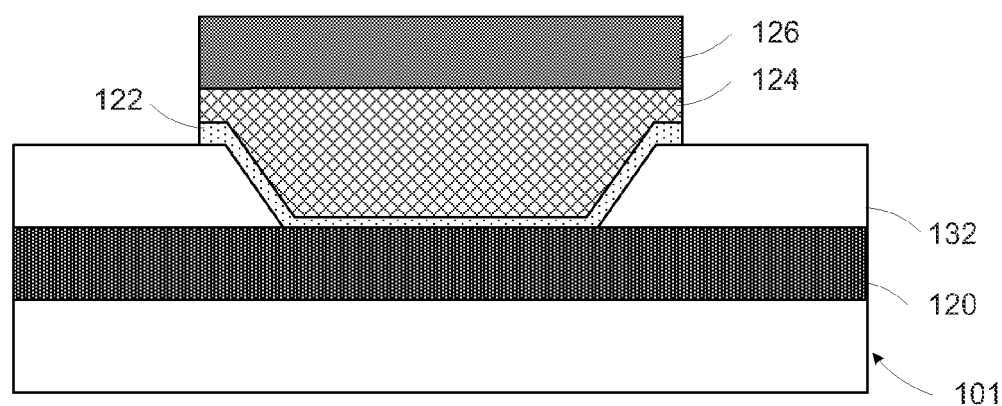

Dielectric tunnel junction layer 122, free magnetic layer 124, and thermal barrier layer 126 can be formed in the trench and on the top surface of the trench layer (132) as shown in FIG. 5c. The thermal barrier layer (126), or both of the thermal barrier layer 126 and the free magnetic layer 124, or all of the three layers 122, 124, and 126 can be patterned to obtain the portion 103 of the MRAM with the desired dimension, as illustrated in FIG. 5d.

Figure 6A:
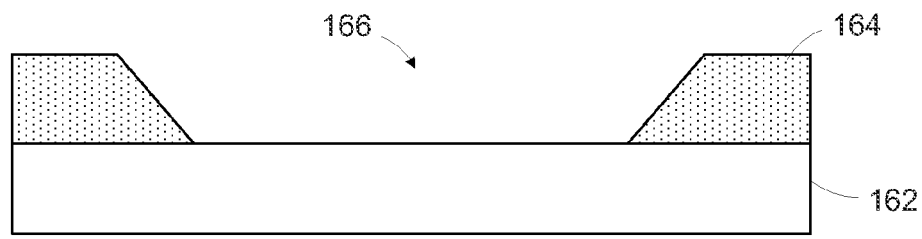
FIG. 6a through FIG. 6d diagrammatically illustrate cross-sectional views of an exemplary electronic devices having a magnetic thin-film component during another exemplary fabrication process.
Figure 6B:
Figure 6C:
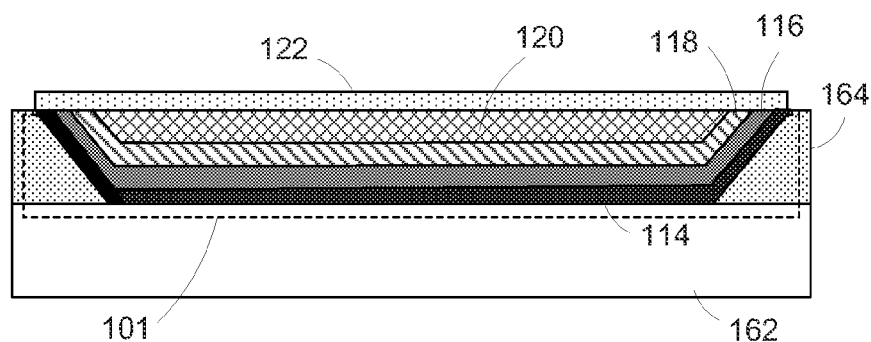

In addition to forming the portion 103 of the MRAM in FIG. 2 by using a trench as discussed above, the first portion 101 of the MRAM can also be formed by using a trench, an example of which is diagrammatically illustrated in FIG. 6a through FIG. 6d. Referring to FIG. 6a, trench 166 is formed in trench layer 164 that is deposited on substrate 162. In an alternative example, a trench (e.g. trench 166) can be directly formed in a trench substrate 168 as diagrammatically illustrated in FIG. 6b. The trench substrate can be comprised of a material for the trench layer 112 as discussed above with reference to FIG. 1a through FIG. 1e. The trench can be formed in the trench substrate 160 by many possible ways, such as photolithography followed by etching The thin film components (e.g. electrode 114, thermal barrier 116, buffer layer 118 (if provided), and the fixed magnetic layer 120) of first portion 101 of the MRAM as shown in FIG. 2 can be consecutively deposited on the trench layer 164 and in the trench 166 followed by CMP or other possible methods (e.g. etching) as diagrammatically illustrated in FIG. 6c. Because the tunnel junction layer 122 often has a thickness around 1 nanometer or less, the tunnel junction layer 122 is preferably deposited on the top surface of fixed magnetic layer 120 by a thin-film deposition technique or other possible techniques, such as epitaxial growth. Alternatively, the tunnel junction layer 122 can be formed by using the trench and the CMP (or other possible techniques) technique as other thin-film components of the first portion 101.

Figure 6D:
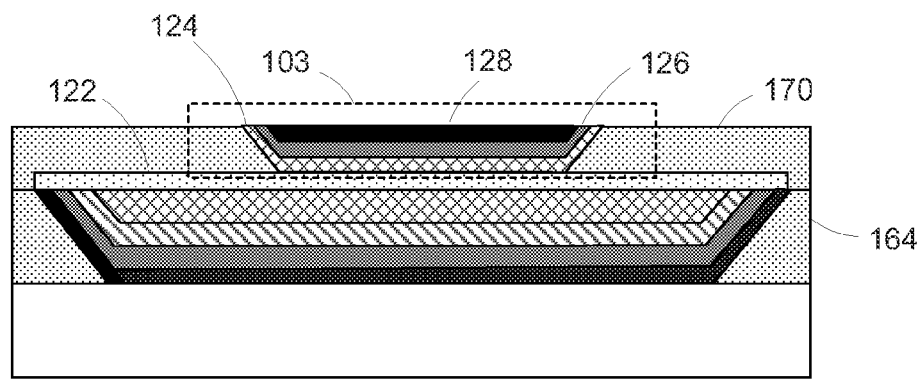

Thin-film components of the second portion 103 of the MRAM in FIG. 2 can be formed on the fabricated first portion 101 by using another trench as diagrammatically illustrated in FIG. 6d. Referring to FIG. 6d, a trench can be formed in trench layer 170 that is deposited on the fabricated first portion 101 and the trench layer 164. Thin-film components of the free magnetic layer 124 and the thermal barrier layer 126 can be consecutively formed in the trench and on the trench layer 170 by using any one of the methods as discussed above with reference to FIG. 3a through FIG. 5d, which will not be repeated herein.

The method implemented for fabricating MRAM cells as discussed above has many advantageous over existing techniques. For example, the lateral critical dimension of a MRAM cell is defined by a trench instead of etching processes as used in current technologies. Specifically, the method avoids, e.g. top magnetic etch (element 100 in FIG. 6c) with complex hard mask or reactive ion etching processes, which are used in current MRAM technologies. The method avoids tunnel barrier shorts that are the most detrimental factor in current etching-based techniques for fabricating MRAMs. By reducing the characteristic dimension of the trench, features of smaller critical dimensions in MRAM cells can be obtained without reducing the performance or properties of MRAM cells. The planarized (e.g. CMP) surface can be subsequently processed for additional features, such as metal lines and contact via using standard process. The planarized CMP surface ensures electric contact openings, which in turn, avoids top contact via to connect the MRAM cell. The method can be substantially fully scalable with substantially no modification for defining features of MRAM cells with reduced critical dimensions. The MRAM cells fabricated thereof may have improved thermal stability (e.g. when the storage layer implemented as bottom magnet) and improved scalability as compared to similar MRAM cells but are fabricated using existing techniques. The MRAM cells fabricated thereof may also have improved temperature window (e.g. when reference layer implemented as bottom magnet with large AR and anit-ferromagnetic biaising layer replaced by SAF) as compared to similar MRAM cells but are fabricated using existing techniques. As a result, higher yields and lower costs of MRAM cells, especially MRAM cell arrays are expected.

It will be appreciated by those skilled in the art that the above methods using a trench are discussed with reference to particular examples of MRAM. In fact, the methods can be implemented to form various MRAM devices or other devices having thin-film components.

Figure 7A:
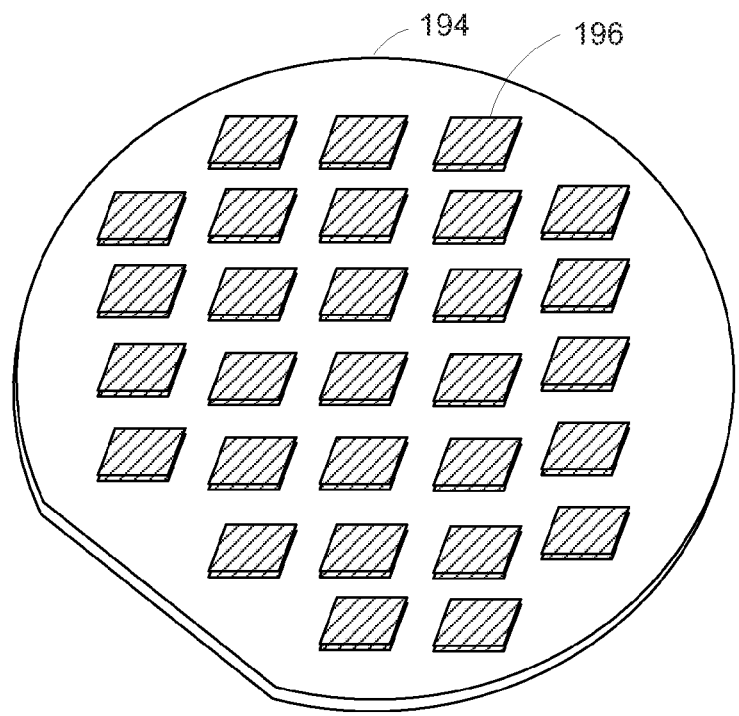
FIG. 7a and FIG. 7b diagrammatically illustrate an exemplary method of making electronic devices having magnetic films on a wafer-level.
Figure 7B:
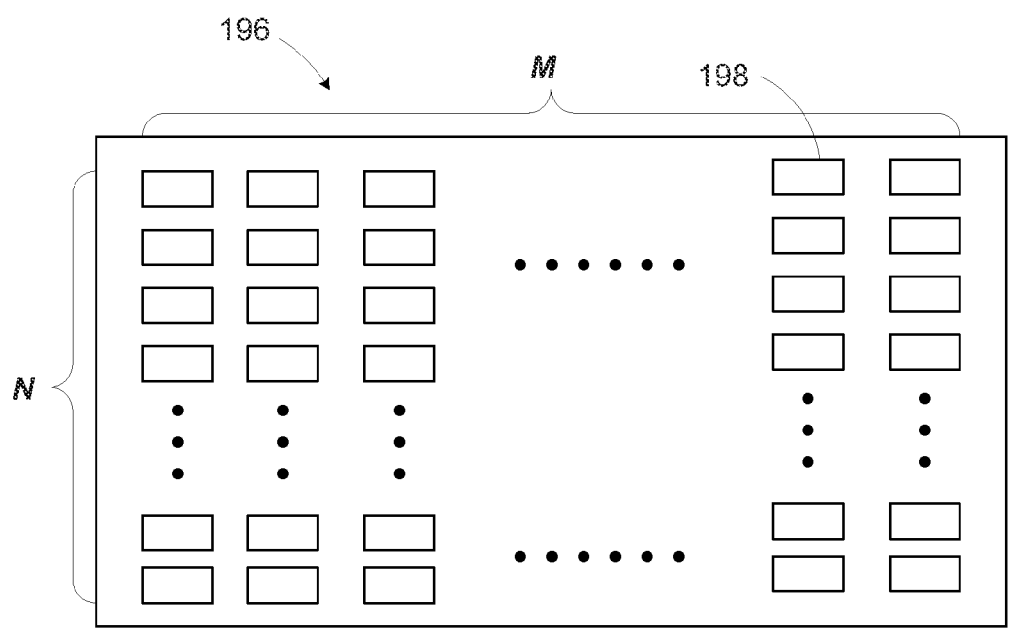

Anyone of the methods of making one or more thin-film components of a device as disclosed above can be implemented to fabricate MRAM and other types of electronic devices on a wafer level as diagrammatically illustrated in FIG. 7a and FIG. 7b. Referring to FIG. 7a, substrate 194 comprising a plurality of die areas (e.g. die area 196) is provided. MRAMs (or other electronic devices) arc formed in the die areas. In one example, an array of MRAMs is formed in each die area as diagrammatically illustrated in FIG. 7b. Referring to FIG. 7b, the array of MRAMs comprises M×N MRAMs (e.g. MRAM 198). M and N can be any desired integer numbers; and the product of M and N is referred to as the capacity of the non-volatile storage of the MRAM array.

The MRAMs can be formed in each die area by using the method as discussed above of this disclosure. After forming the MRAM arrays in the die areas, the die areas can be singulated from the wafer so as to obtain individual MRAM chips.

It will be appreciated by those of skill in the art that a new and useful method for forming electronic devices by using trenches have been described herein. In view of the many possible embodiments, however, it should be recognized that the embodiments described herein with respect to the drawing figures are meant to be illustrative only and should not be taken as limiting the scope of what is claimed. Those of skill in the art will recognize that the illustrated embodiments can be modified in arrangement and detail. Therefore, the devices and methods as described herein contemplate all such embodiments as may come within the scope of the following claims and equivalents thereof.

We claim:

1. A method of forming a device, comprising:
   providing a substrate comprising a first magnetic layer, wherein a tunnel junction layer is disposed on the first magnetic layer;
   depositing a trench layer on the tunnel junction layer;
   etching the trench layer to form a trench, wherein the etching is stopped by the tunnel junction layer, and wherein a portion of the tunnel junction layer is exposed at the bottom of the trench;
   depositing a stack of thin films in the trench and on the trench layer; and
   processing the deposited stack of thin films and the trench layer to form a plurality of thin-film components of the device within the trench.

2. The method of claim 1, wherein at least one of the plurality of thin-film components is positioned on top of at least another one of the plurality of thin-film components.

3. The method of claim 1, wherein processing the deposited stack of thin films and the trench layer further comprises removing a portion of the deposited stack of thin films such that a total thickness of the plurality of thin-film components within the trench is substantially the same as a depth of the trench.

4. The method of claim 1, wherein the step of processing the deposited stack of thin films comprises processing the deposited stack of thin films and the trench layer using a chemical-mechanical-polishing technique.

5. The method of claim 1, wherein the plurality of thin-film components within the trench comprises a second magnetic layer that is a free magnetic layer, and the first magnetic layer is a fixed magnetic layer.

6. The method of claim 5, wherein the plurality of thin-film components further comprises a thermal barrier for preventing thermal leakage from the free magnetic layer.

7. The method of claim 1, wherein the plurality of thin-film components within the trench comprises a second magnetic layer that is a fixed magnetic layer, and the first magnetic layer is a free magnetic layer.

8. The method of claim 1, further comprising removing the trench layer.

9. The method of claim 1, wherein providing the substrate comprises:
   providing a sacrificial substrate;
   forming another trench, comprising;
      depositing another trench layer on said sacrificial substrate; and
      forming another trench in said another trench layer;
   forming another plurality of thin-film components of the device in the trench, comprising:
      depositing a plurality of thin films in the trench and on the sacrificial substrate; and
      removing at least a portion of the deposited thin films such that the another plurality of thin-film components are within said another trench.

10. The method of claim 9, wherein the another plurality of thin-film components comprises a thermal barrier layer for preventing thermal leakage from the first magnetic layer.

11. The method of claim 1, wherein the trench has a lateral characteristic dimension of 65 nanometers or less.

12. The method of claim 1, wherein the trench has a sloped sidewall.

13. The method of claim 12, wherein the plurality of thin-film components within the trench comprises a second magnetic layer that substantially covers the exposed portion of the tunnel junction layer at the bottom of the trench without substantially covering the sloped sidewall.

14. The method of claim 12, wherein the plurality of thin-film components within the trench comprises a second magnetic layer that substantially covers the sloped sidewall and the exposed portion of the tunnel junction layer at the bottom of the trench.

15. The method of claim 1, wherein the device is a magnetic-random-access memory cell.

16. The method of claim 1, wherein the substrate includes the tunnel junction layer.

* * * * *